United States Patent
Yamada et al.

[19]

[11] Patent Number: 6,104,260
[45] Date of Patent: Aug. 15, 2000

[54] SURFACE ACOUSTIC WAVE FILTER WITH FIRST AND SECOND FILTER TRACKS AND BALANCED OR UNBALANCED TERMINALS

[75] Inventors: Toru Yamada, Katano; Shigeru Tsuzuki; Hiroyuki Nakamura, both of Neyagawa, all of Japan

[73] Assignee: Matsushita Electric Industrial Co., Ltd., Osaka, Japan

[21] Appl. No.: 09/216,941

[22] Filed: Dec. 21, 1998

[30] Foreign Application Priority Data

Dec. 22, 1997 [JP] Japan ................................ 9-353067
Jan. 13, 1998 [JP] Japan ................................ 10-005173

[51] Int. Cl.⁷ .................................................. H03H 9/64
[52] U.S. Cl. ......................... 333/193; 333/195; 333/196
[58] Field of Search .................................. 333/193–196; 310/313 R, 313 B, 313 C, 313 D

[56] References Cited

U.S. PATENT DOCUMENTS

| | | | |
|---|---|---|---|
| 3,727,155 | 4/1973 | DeVries | 333/194 |
| 3,946,342 | 3/1976 | Hartmann | 333/196 |
| 4,178,571 | 12/1979 | Mitchell | 333/194 |
| 4,425,554 | 1/1984 | Morishita | 333/195 |
| 5,313,177 | 5/1994 | Hickernell et al. | 333/193 |
| 5,349,260 | 9/1994 | Anemogiannis et al. | 333/195 X |
| 5,357,228 | 10/1994 | Dufilie | 333/195 |
| 5,379,010 | 1/1995 | Ruile et al. | 333/195 |
| 5,475,348 | 12/1995 | Hode et al | 333/195 |
| 5,521,565 | 5/1996 | Anemogiannis | 333/195 |
| 5,646,584 | 7/1997 | Kondratyev et al. | 333/193 |
| 5,661,444 | 8/1997 | Dill et al. | 333/193 X |
| 5,663,695 | 9/1997 | Tanaka et al. | 333/193 |
| 5,831,494 | 11/1998 | Solie | 333/193 |
| 5,896,071 | 4/1999 | Dai et al. | 333/193 |
| 5,896,072 | 4/1999 | Bergmann et al. | 333/195 |

*Primary Examiner*—Robert Pascal
*Assistant Examiner*—Barbara Summons
*Attorney, Agent, or Firm*—Smith, Gambrell & Russell, LLP

[57] ABSTRACT

A surface acoustic wave filter. The filter includes two filter tracks which are parallel to each other. Each track has an input interdigital transducer, reflector and output interdigital transducer. This distance between the input transducer and output transducer is the same in both tracks. The distance between the output transducer and reflector is different in the two tracks. The electrical connection is in opposite phase in either the inputs or outputs, but not both. Electrode fingers are arranged in groups of two and have widths and spacings related to the wavelength.

17 Claims, 15 Drawing Sheets

SURFACE ACOUSTIC WAVE FILTER WITH FIRST AND SECOND FILTER TRACKS AND BALANCED OR UNBALANCED TERMINALS

BACKGROUND OF THE INVENTION

1. Field of the Invention

The present invention relates to a surface acoustic wave filter for use in, for example, high-frequency circuits in radio communication devices.

2. Related Art of the Invention

The electromechanical components using a surface acoustic wave have received attention in the tide toward higher density of hardware due to the following fact, that is, the acoustic velocity of the wave is several km/s, and the energy of the wave has a property of concentrating on the surface of a propagation medium. Also, with the advance of thin film forming technology and surface processing technology which have enabled the development of an interdigital transducer (below, referred to as IDT) electrode, and the transformation and expansion thereof, they have been applied to practical use for radar delay lines and band-pass filters for television receivers. At present, they have come in wide use as filters of RF and IF stages in transmitter-receiver circuits of radio communication devices. In recent years, there has been under way the increasing development of portable telephones, digital cordless telephones, and the like with the digitization of mobile communication devices. This results in an expanded occupied bandwidth per channel. Especially, IF filters for use in a CDMA (code division multiplex) which has attracted attention in recent years have been required to have characteristics excellent in broad-band and extremely flat group delay time deviation and selectivity for differentiating between adjacent-channel signals and desired signals.

Conventionally, as surface acoustic wave filters suitable for an IF stage, resonator type surface acoustic wave filters and transversal type surface acoustic wave filters are well known. The resonator type surface acoustic wave filter has narrow-band and steep cut-off characteristics, and also small insertion loss and device size, while being inferior in group delay time characteristic. On the other hand, the transversal type surface acoustic wave filter has large insertion loss and device size, while having a broad-band and flat group delay time deviation characteristic. From the foregoing features, the transversal type surf ace acoustic wave filter is suitable for use as IF filter in CDMA(code division multiple access).

Below, a description will now be given to a conventional transversal type surface acoustic wave filter.

FIG. 15 is a block diagram showing a transversal type surface acoustic wave filter in accordance with prior art. Referring now to FIG. 15, the reference numeral 151 denotes a single crystal piezoelectric substrate. On the piezoelectric substrate 151, is formed an electrode pattern, which enables the excitation of a surface acoustic wave. The reference numeral 152 represents an input IDT electrode pair, from which an output IDT electrode pair 153 is formed at a prescribed distance, thus forming a transversal type surface acoustic wave filter.

With the surface acoustic wave filter configured as described above, various weights are assigned to the input and output IDT electrode pairs 152 and 153, alternatively, any one of, or both of the input and output IDT electrode pairs 152 and 153 are set to be a unidirectional IDT electrode pair, or the like. This determines the frequency characteristics of the filter, thus implementing the filter characteristic with a broad bandwidth and being flat within the passband.

Incidentally, a reduction in size and weight of portable remote terminals has proceeded in recent years, with which miniaturization has been also required of the surface acoustic wave filter of the IF stage. Further, the balanced input and output of ICs in stages around that of the IF filter has advanced, and the balanced input and output type has been also required of the IF filter strongly. Excellent attenuation amount outside the passband has been also required for differentiating between adjacent-channel signals and desired signals.

However, in the case where steep attenuation characteristics in the vicinity of the passband is obtained with the above-described transversal type, sufficient weighting is required of the input and output IDTs. This entails a problem that each length of the input and output IDTs is increased, which leads to a difficulty in miniaturization thereof. Further, weighting results in a difference in configuration between the upper electrode and the lower electrode of the IDT electrode pair 152, which creates a problem of bad balancing.

SUMMARY OF THE INVENTION

A surface acoustic wave filter of the present invention comprises:

a piezoelectric substrate; a first filter track having a first input interdigital transducer, a first reflector, and a first output interdigital transducer disposed therebetween; and a second filter track having a second input interdigital transducer, a second reflector, and a second output interdigital transducer disposed therebetween on said piezoelectric substrate, wherein said first filter track and said second filter track are substantially arranged in parallel to each other, the distance between said first input interdigital transducer and said first output interdigital transducer is equal to the distance between said second input interdigital transducer and said second output interdigital transducer, the distance between said first output interdigital transducer and said first reflector differs from the distance between said second output interdigital transducer and said, second reflector by $(n\lambda+\lambda/4)$ (n: natural number), assuming that the wavelength of the surface acoustic wave is $\lambda$, an electrical connection mutually in opposite phase is established for any one of between said first input interdigital transducer and said second input interdigital transducer, or between said first output interdigital transducer and said second output interdigital transducer, while an electrical connection mutually in phase is established for the other, and each positive electrode and negative electrode of respective output interdigital transducers of said first and second filter tracks are both so configured that, electrode fingers are arranged in groups of two in a cycle of $\lambda$, each of the electrode fingers has a width along the surface acoustic wave propagation direction of approximately $\lambda/8$, while the center-to-center distance between the two electrode fingers of the one group is $\lambda/4$, and the space between adjacent, one pair of electrode fingers of said positive electrode and one pair of electrode fingers of said negative electrode is $\lambda/2$.

A surface acoustic wave filter of the present invention, comprises:

a piezoelectric substrate; a first filter track having a first input interdigital transducer, and a first output interdigital transducer; and a second filter track having a second input interdigital transducer, and a second output interdigital transducer on said piezoelectric substrate, wherein said first input interdigital transducer and said first output interdigital transducer are arranged at a prescribed distance from each other, said second input interdigital transducer and said second output interdigital transducer are arranged at a prescribed distance from each other, said first filter track and said second filter track are substantially arranged in parallel to each other, said first filter track and said second filter track have a symmetrical construction along the surface acoustic wave propagation direction as axial direction, both the lower electrode of said first input interdigital transducer and the upper electrode of said second input interdigital transducer are grounded, both the lower electrode of said first output interdigital transducer and the upper electrode of said second output interdigital transducer are grounded, the upper electrode of said first input interdigital transducer and the lower electrode of said second input interdigital transducer form balanced type input terminals, and the upper electrode of said first output interdigital transducer and the lower electrode of said second output interdigital transducer form balanced type output terminals A surface acoustic wave filter of the present invention comprises:

a piezoelectric substrate; a first filter track having a first input interdigital transducer, and a first output interdigital transducer; and a second filter track having a second input interdigital transducer, and a second output interdigital transducer on said piezoelectric substrate, wherein said first input interdigital transducer and said first output interdigital transducer are arranged at a prescribed distance from each other, said second input interdigital transducer and said second output interdigital transducer are arranged at a prescribed distance from each other, said first filter track and said second filter track are substantially arranged in parallel to each other, said first filter track and said second filter track have such an asymmetrical construction that if said first filter track is shifted in the surface acoustic wave propagation direction with respect to said second filter track by an integral multiple of $\lambda/2$ ($\lambda$: wavelength of the surface acoustic wave propagating on the piezoelectric substrate), said first filter track and said second filter track have a symmetrical construction along the surface acoustic wave propagation direction as axial direction, both the lower electrode of said first input interdigital transducer and the upper electrode of said second input interdigital transducer are grounded, both the lower electrode of said first output interdigital transducer and the upper electrode of said second output interdigital transducer are grounded, the upper electrode of said first input interdigital transducer and the lower electrode of said second input interdigital transducer form balanced type input terminals, and the upper electrode of said first output interdigital transducer and the lower electrode of said second output interdigital transducer form balanced type output terminals.

A surface acoustic wave filter of the present invention comprises:

a piezoelectric substrate, an input interdigital transducer, and an output interdigital transducer formed at a prescribed distance from said input interdigital transducer, on said piezoelectric substrate, wherein any one of said input interdigital transducer or said output interdigital transducer is a single phase uni-directional transducer (SPUDT), and assuming that a difference between the frequency f1h of the pole on a high-pass side closest to the center frequency and the frequency f1l of the pole on a low-pass side closest to the center frequency in the impulse response characteristic of said input interdigital transducer is $\Delta f1$, while a difference between the frequency f2h of the pole on a high-pass side closest to the center frequency and the frequency f2l of the pole on a low-pass side closest to the center frequency in the impulse response characteristic of said output interdigital transducer is $\Delta f2$, the interdigital transducer having the smaller one of said $\Delta f1$ and $\Delta f2$ is a SPUDT electrode.

A communication device of the present invention comprises: said surface acoustic wave filter according to any one of the present invention: a signal processing circuit for processing a signal by the use of said filter; a transmitter for transmitting the signal processed by said signal processing circuit, and a receiver for receiving an electronic radio wave.

The foregoing configuration results in a small-sized surface acoustic wave filter having balanced type input and output terminals, with low insertion loss, flat passband characteristics, and excellent attenuation characteristics in the vicinity of the passband.

PREFERRED EMBODIMENT OF THE INVENTION

Below, a description will now be given to the embodiments of the present invention with reference to drawings.

(Embodiment 1)

Figure 1:
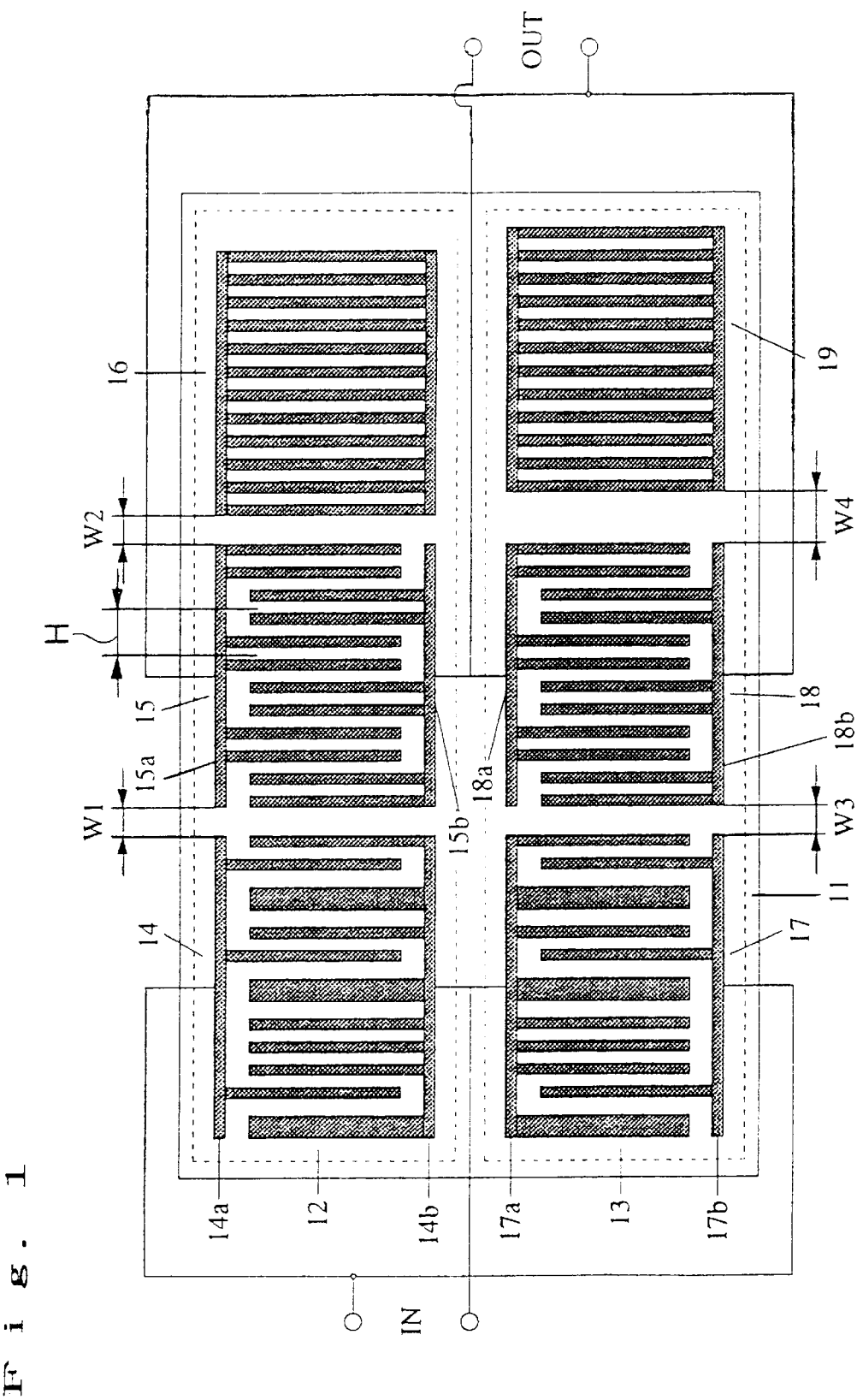
FIG. 1 is a block diagram of an electrode pattern of a surface acoustic wave filter in accordance with a first embodiment of the present invention.

FIG. 1 is an electrode pattern block diagram showing a first embodiment of a surface acoustic wave filter according to the present invention. On a single crystal piezoelectric substrate 11 shown in FIG. 1, is formed an electrode pattern in stripline of a periodic structure, enabling the excitation of a surface acoustic wave. On the piezoelectric substrate 11, are formed a first filter track 12 and a second filter track 13. The first filter track 12 is comprised of an input IDT 14, an output IDT 15, and a reflector 16. Similarly, the second filter track13 is comprised of an input IDT 17, an output IDT 18, and a reflector 19. The distance W1 between the input IDT 14 and the output IDT 15 of the first filter track 12 is equal to the distance W3 between the input IDT 17 and the output IDT 18 of the second filter track 13. Assuming that the wavelength of the surface acoustic wave is $\lambda$, the distance W2 between the output IDT 15 and the reflector 16 of the first filter track 12 differs from the distance W4 between the output IDT 18 and the reflector 19 of the second filter track 13 by $n\lambda+\lambda/4$ (n: natural number).

The input IDTs 14 and 17 are single phase uni-directional transducers (SPUDTs). Further, the input IDT 14 and the input IDT 17 are electrically connected in phase with each other (that is, the arrangements of their respective electrode fingers are mutually equal), while the output IDT 15 and the output IDT 18 are electrically connected in opposite phase to each other (that is, the arrangements of their respective electrode fingers are displaced from each other), thus forming balanced type terminals, respectively.

In the output IDT 15 of the first filter track 12, electrode fingers are arranged in groups of two in a cycle of $\lambda$ at both of a positive electrode 15a and a negative electrode 15b, respectively. Each of the electrode fingers has a width along the propagation direction of surface acoustic wave of approximately $\lambda/8$, while the center-to-center distance between the two electrode fingers of the one group is $\lambda/4$. Further, the space between adjacent, one pair of electrode fingers of the positive electrode 15a and one pair of electrode fingers of the negative electrode 15b is $\lambda/2$. That is, the space H between the central point of the one pair of electrode fingers and the central point of the other pair of electrode fingers is $\lambda/2$. Hereinafter, an IDT configured in such a manner is referred to as double electrode.

Similarly, the output IDT 18 of the second filter track 13 also constitutes the double electrode. That is, in the IDT 18, electrode fingers are arranged in groups of two in a cycle of $\lambda$ at both of a positive electrode 18a and a negative electrode 18b, respectively. Each of the electrode fingers has a width along the propagation direction of surface acoustic wave of approximately $\lambda/8$, while the center-to-center distance between the two electrode fingers of the one group is $\lambda/4$. Further, the space between adjacent, one pair of electrode fingers of the positive electrode 18a and one pair of electrode fingers of the negative electrode 18b is $\lambda/2$.

As to the surface acoustic wave filter configured as described above, the operation thereof will now be described below.

The propagation path of a surface acoustic wave is considered in the embodiment 1 of the present invention shown in FIG. 1. The respective surface acoustic waves excited at the input IDTs 14 and 17 reach the output IDTs 15 and 18. However, these surface acoustic waves cannot be extracted as electric signal from the output IDTs 15 and 18 due to the fact that the electric phase difference between the output IDT 15 of the first filter track 12 and the output IDT 18 of the second filter track 13 is 180°. Then, these surface acoustic waves pass through the output IDTs 15 and 18 to be reflected by the reflectors 16 and 19, respectively. In the reflection, the distance W2 and the distance W4 are mutually different, and hence the surface acoustic waves become 180° out of phase with each other. The electrical phase difference between the output IDT 15 of the first filter track 12 and the output IDT 18 of the second filter track 13 is 0°, and hence the out-of-phase surface acoustic waves can be extracted as output signal there.

Thus, the surface acoustic wave propagation path is folded back by the use of the reflector, resulting in steep attenuation characteristics in the vicinity of the passband without an increase in number of electrode fingers of the input and output IDTs. On the other hand, with the conventional surface acoustic wave filter shown in FIG. 15, the surface acoustic wave excited at the IDT 152 can be received at the output IDT 153 to be extracted as electric signal. Therefore, the number of electrode fingers of the input and output IDTs must be largely increased in order to obtain steep attenuation characteristics in the vicinity of the passband. Accordingly, the surface acoustic wave filter of this embodiment shown in FIG. 1 is largely reduced in filter size as compared with the prior art surface acoustic wave filter shown in FIG. 15.

Figure 2:
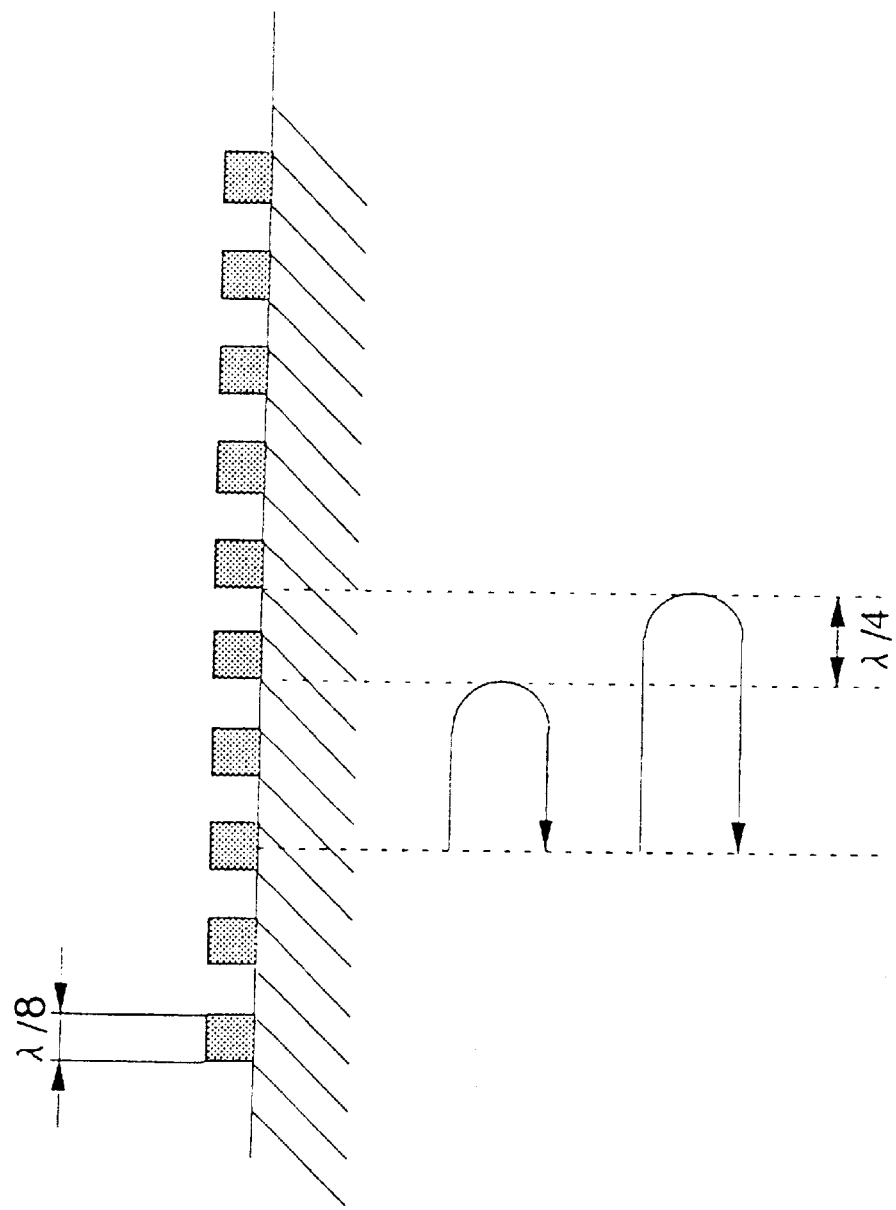
FIG. 2 is a diagram illustrating the operation of the surface acoustic wave filter in accordance with the present invention shown in FIG. 1.

Further, the output IDT 15 of the first filter track 12 and the output IDT 18 of the second filter track 13 are double electrodes. Accordingly, as shown in FIG. 2, the surface acoustic waves each reflected at the end face of its respective electrode finger have a phase difference of $\lambda/2$ to be canceled, which enables the suppression of the internal reflection. Consequently, the surface acoustic waves propagated from the input IDTs 14 and 17 to the reflectors 16 and 19 are not disturbed at the output IDTs 15 and 18 to pass therethrough, which enables the implementation of filter characteristics being flat within the passband.

Also, in the embodiment 1 of the present invention shown in FIG. 1, the input IDT 14 of the first filter track 12 and the input IDT 17 of the second filter track 13 are uni-directional transducers such as single phase unidirectional transducer (SPUDT). Accordingly, the bi-directional loss at the input IDTs can be reduced to implement low-loss filter characteristics.

It is noted that, the input IDT 14 of the first filter track 12 and the input IDT 17 of the second filter track 13 can properly be double electrodes each with an electrode finger width of λ/8. In this case, the internal reflection can be suppressed to implement filter characteristics with broad and flat passband.

Also, the reflection coefficients of the reflectors 16 and 19 are set as roughly 1, which causes the surface acoustic waves reaching the reflectors 16 and 19 to totally reflect. This results in no leaking surface acoustic wave, enabling the implementation of low-loss filter characteristics.

(Embodiment 2)

Figure 3:
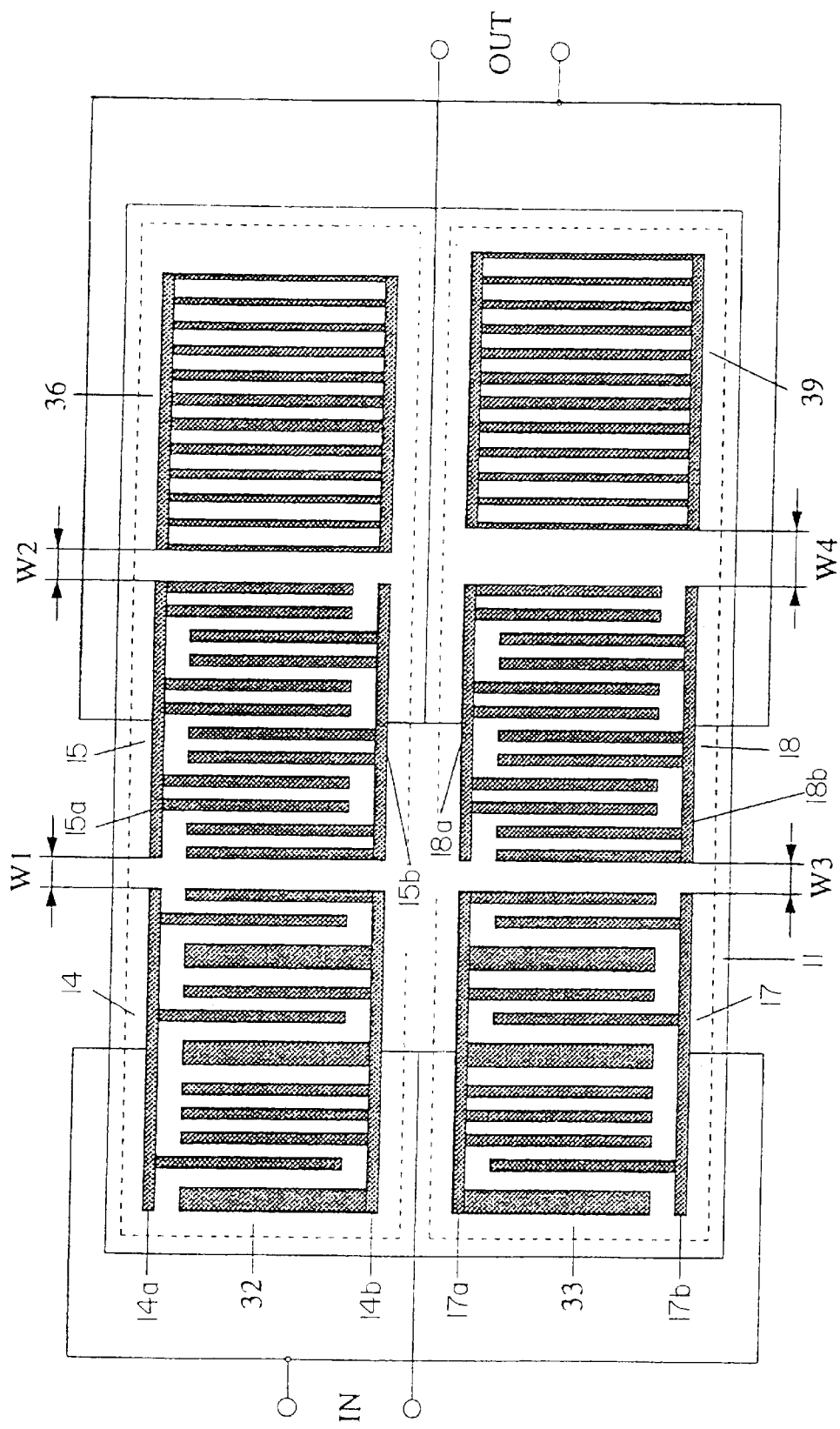
FIG. 3 is a block diagram of an electrode pattern of a surface acoustic wave filter in accordance with a second embodiment of the present invention.

FIG. 3 is a block diagram of an electrode pattern showing a second embodiment in accordance with the present invention. The difference from the embodiment 1 shown in FIG. 1 is in that on each of a reflector 36 of a first filter track 32 and a reflector 39 of a second filter track 33, weighting based on the width along the surface acoustic wave propagation direction of the electrode finger is performed. This enables the expansion of the degree of freedom of filter design. Alternatively, weighting based on the position of the electrode finger, and weighting based on the combination of the foregoing two terms can be carried out.

Figure 4:
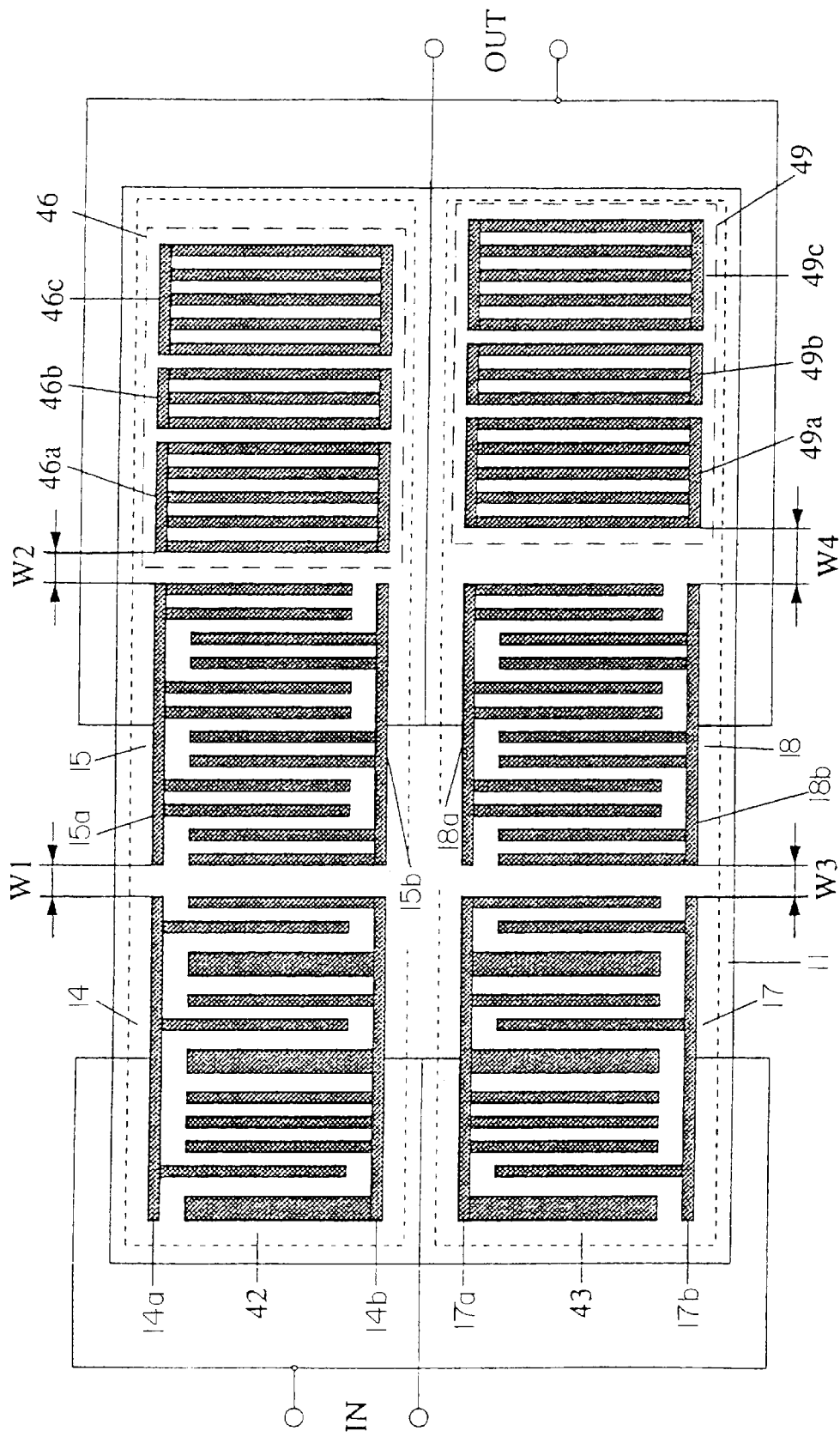
FIG. 4 is a block diagram of an electrode pattern of a surface acoustic wave filter in accordance with the second embodiment of the present invention.

FIG. 4 is a block diagram of an electrode pattern in which the reflector 36 of the first filter track 32 and the ref lector 39 of the second filter track 33 are each comprised of at least two or more reflectors each having a different reflection characteristic. Referring now to FIG. 4, a reflector 46 of a first filter track 42 is comprised of reflector electrodes 46a, 46b, and 46c each having a different reflection characteristic, while a reflector electrode 49 of a second filter track 43 is comprised of reflectors 49a, 49b, and 49c each having a different reflection characteristic. The use of such a configuration enables the expansion of the degree of freedom of filter design, and hence the desired reflection characteristic can be obtained with ease.

It is noted that, as shown in FIG. 1 in the embodiments 1 and 2, the input IDTs are electrically connected in phase with each other, while the output IDTs are electrically connected in opposite phase to each other. However, even if the input IDTs are electrically connected in opposite phase to each other, while the output IDTs are electrically connected in phase with each other, the same effects can be obtained.

(Embodiment 3)

Figure 5:
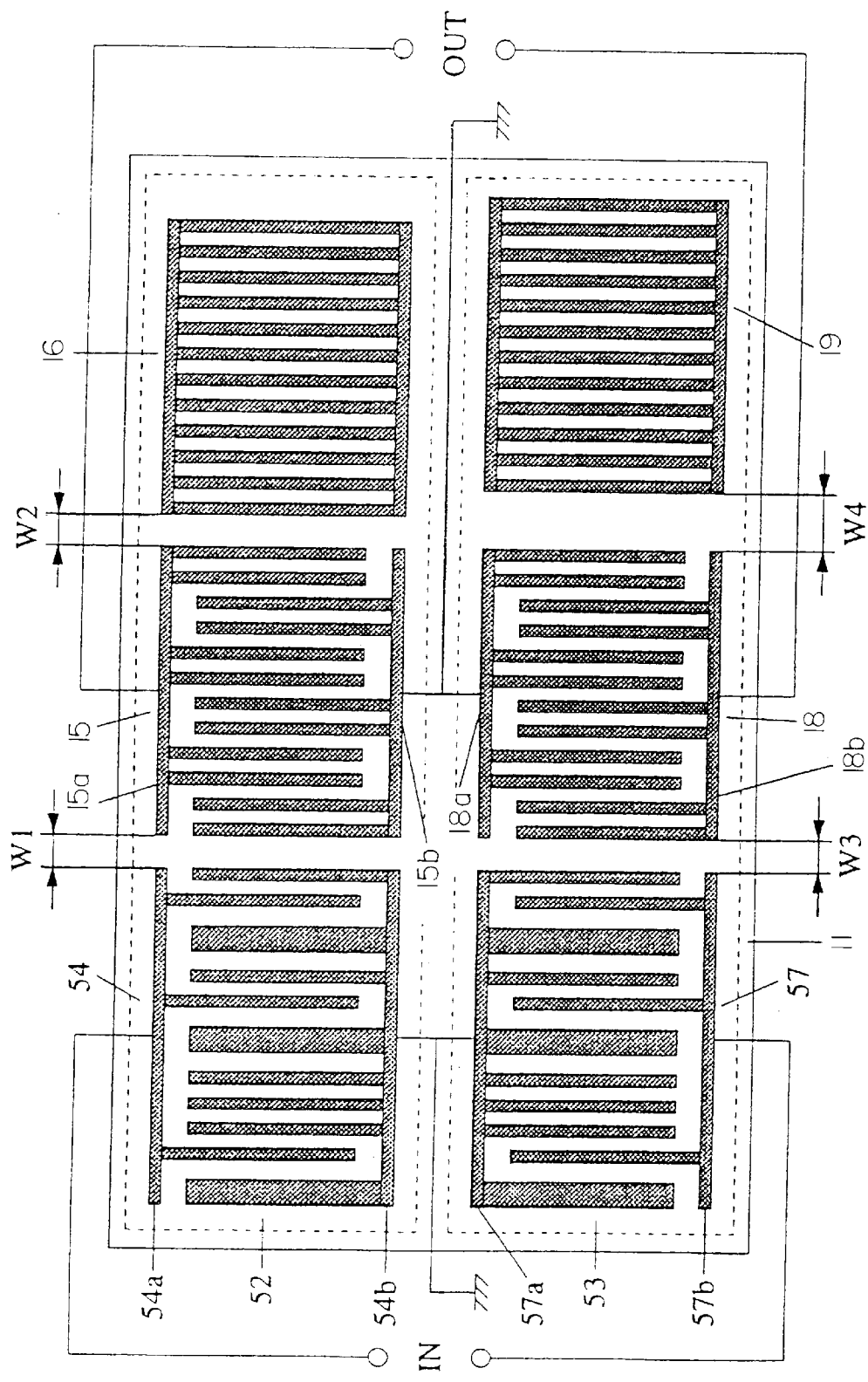
FIG. 5 is a block diagram of an electrode pattern of a surface acoustic wave filter in accordance with a third embodiment of the present invention.

FIG. 5 is a block diagram of an electrode pattern showing a third embodiment of the surface acoustic wave filter in accordance with the present invention. The difference from the embodiment 1 shown in FIG. 1 is as follows: in the embodiment 1, a connection is provided between the upper electrode 14a of the input IDT 14 of the first filter track 12 and the lower electrode 17b of the input IDT 17 of the second filter track 13 to form one of the balanced type input terminals. Meanwhile, a connection is provided between the lower electrode 14b of the input IDT 14 of the first filter track 12 and the upper electrode 17a of the input IDT 17 of the second filter track 13 to form the other of the balanced type input terminals. Thus, the balanced type input is implemented. On the other hand, in the embodiment 3 shown in FIG. 5, the upper electrode 54a of an input IDT 54 of a first filter track 52 and the lower electrode 57b of an input IDT 57 of a second filter track 53 form balanced type input terminals. Meanwhile, the lower electrode 54b of the input IDT 54 of the first filter track 52 and the upper electrode 57a of the input IDT 57 of the second filter track 53 are grounded.

The routing of wiring in the foregoing manner provides parallel to series connections of the cross capacities of the IDTs, which can raise the impedance of the filter without a reduction in cross width of the IDTs. In the case where the foregoing routing of wiring is not carried out, an increase in impedance of the filter requires the cross capacity of the IDTs controlling the impedance of the filter to be reduced. This requires the cross width of the IDTs to be made small. As a result, the diffraction effect of surface acoustic waves is enhanced, resulting in deterioration in attenuation characteristics on the high frequencies side. However, the foregoing configuration enables an increase in impedance of the filter without reducing the cross width of the IDTs to implement filter characteristics with good attenuation characteristics on the high frequencies side.

Figure 6:
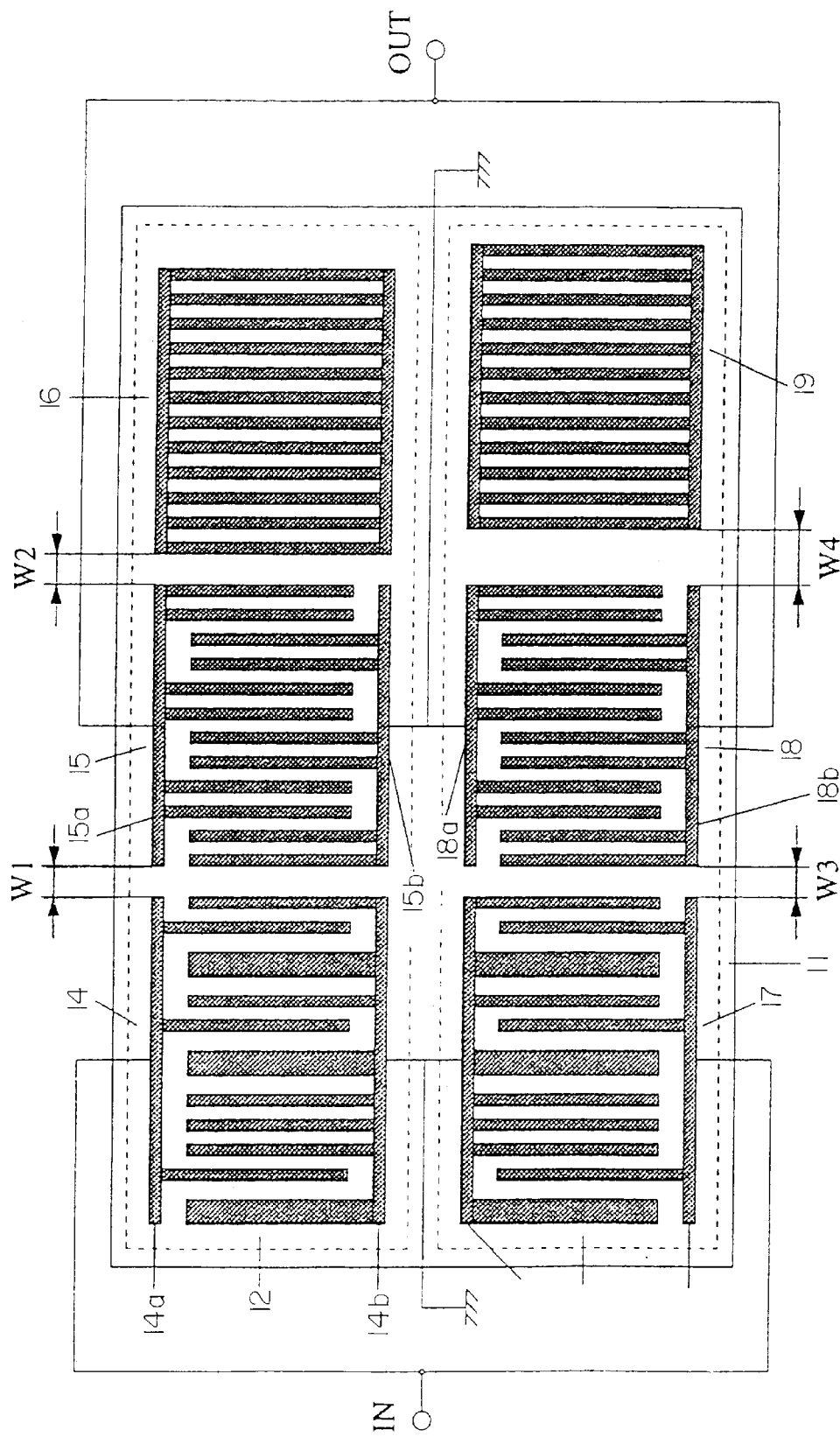
FIG. 6 is a block diagram of an electrode pattern of a surface acoustic wave filter in accordance with the third embodiment of the present invention.
Figure 7:
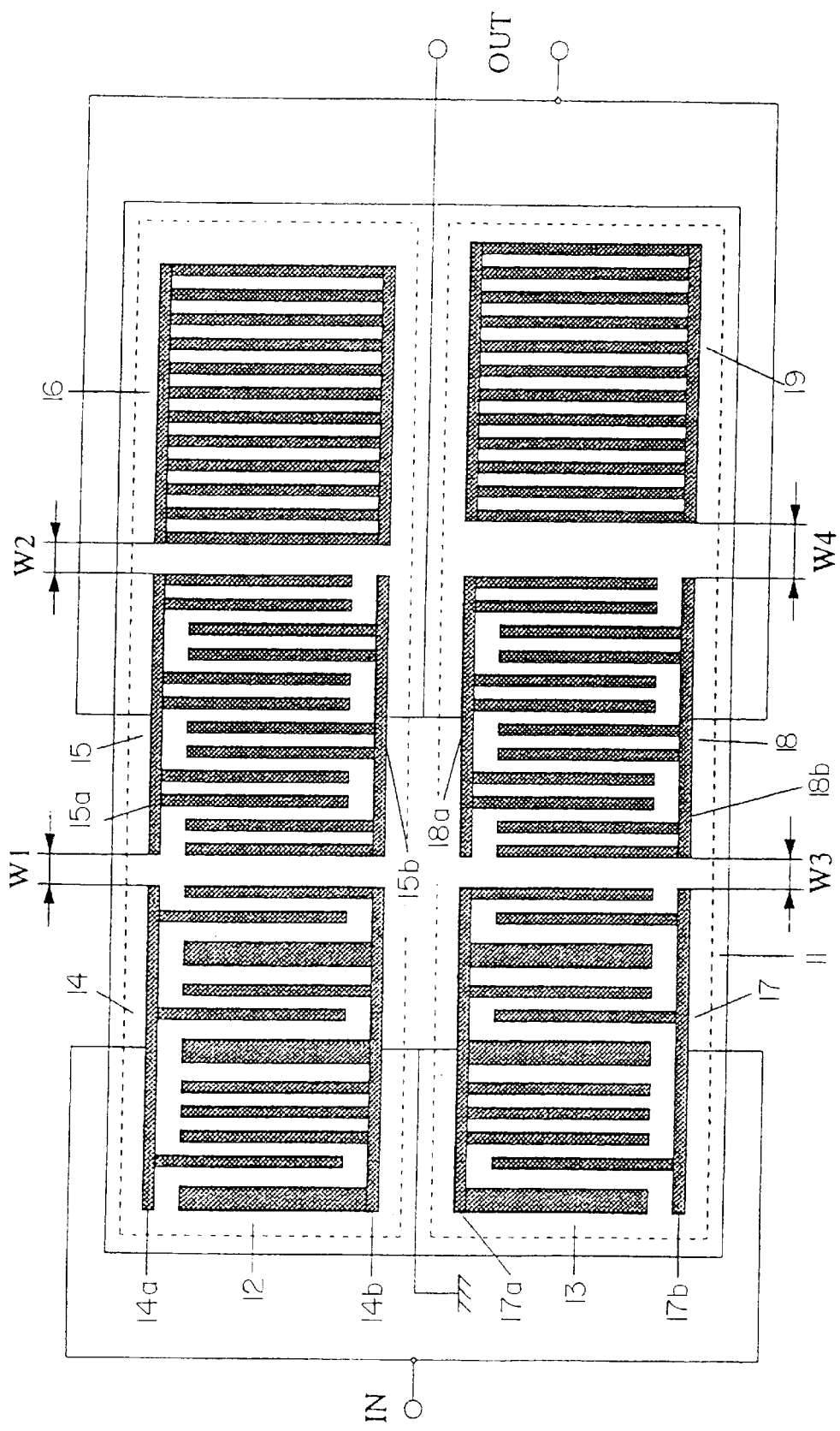
FIG. 7 is a block diagram of an electrode pattern of a surface acoustic wave filter in accordance with the third embodiment of the present invention.

It is noted that, in the embodiments 1, 2, and 3, the description is given with filters of the balanced type input and output configuration being taken as examples. However, even with the unbalanced type as shown in FIG. 6, or even if the input and output terminals are configured wherein the one is of a balanced type, while the other is of an unbalanced type as shown in FIG. 7, the same filter characteristics can be implemented.

It is noted that the routing of wiring for the input IDTs is described in FIG. 5. However, the same effects can be obtained for the output IDTs.

(Embodiment 4)

Figure 8:
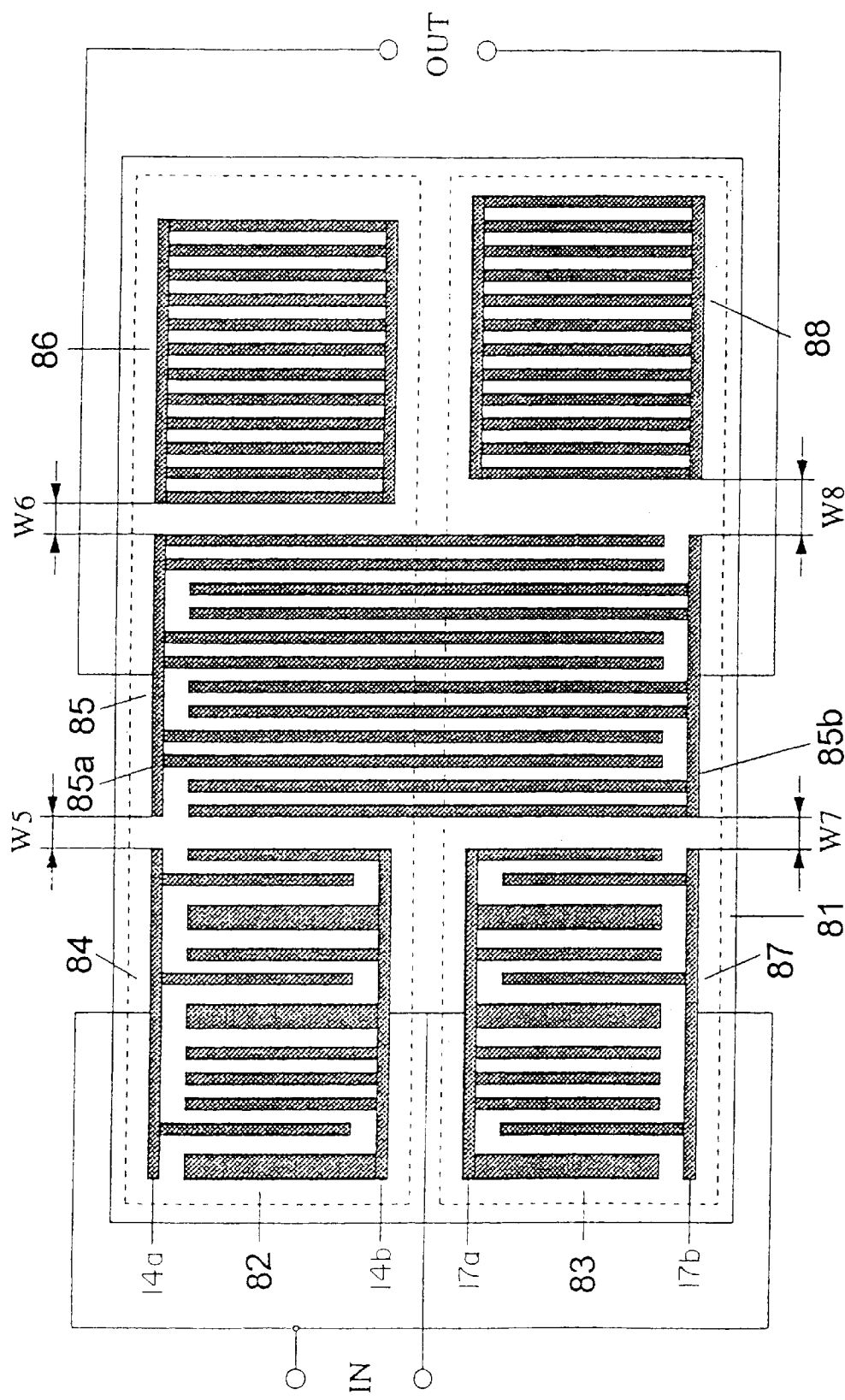
FIG. 8 is a block diagram of an electrode pattern of a surface acoustic wave filter in accordance with a fourth embodiment of the present invention.

FIG. 8 is a block diagram of an electrode pattern showing a fourth embodiment of the surface acoustic wave filter in accordance with the present invention. On a piezoelectric substrate 81, are formed a first filter track 82 and a second filter track 83. The first filter track 82 is comprised of an input IDT 84, a multi-strip coupler 85, and a reflector 86. Similarly, the second filter track 83 is comprised of an input IDT 87, a multi-strip coupler 85, and a reflector 88. The input IDT 84 of the first filter track 82 and the input IDT 87 of the second filter track 83 have the same electrode configuration. Similarly, the reflector electrode 86 of the first filter track 82 and the reflector electrode 88 of the second filter track 8 have the same electrode configuration.

The distance W5 between the input IDT 84 and the multi-strip coupler 85 of the first filter track 82 is equal to the distance W7 between the input IDT 87 and the multi-strip coupler 85 of the second filter track 83. The distance W6 between the multi-strip coupler 85 and the reflector electrode 86 of the first filter track 82 differs from the distance W8 between the multi-strip coupler 85 and the reflector electrode 88 of the second filter track 83 by nλ+λ/4 (n: natural number). Further, the input IDT 84 of the first filter track 82 and the input IDT 87 of the second filter track 83 are electrically connected in phase with each other to form balanced type input terminals, while the upper electrode 85a and the lower electrode 85b of the multi-strip coupler 85 form balanced type output terminals.

In the multi-strip coupler 85, both the positive electrode 85a and the negative electrode 85b are comprised of double electrodes, respectively. That is, in both the electrodes, electrode fingers are arranged in groups of two in a cycle of λ. Each of the electrode fingers has a width along the surface acoustic wave propagation direction of approximately λ/8, while the center-to-center distance between the two electrode fingers of the one group is λ/4. Further, the space H between adjacent, one pair of electrode fingers of the positive electrode 85a and one pair of electrode fingers of the negative electrode 85b is λ/2.

As shown in FIG. 8, even if the multi-strip coupler 85 is used in place of the output IDTs, the same filter characteristics as those in the embodiment 1 of the present invention of FIG. 1 can be implemented, and a routing electrode for an output terminal can be taken out easily, or the length of the routing electrode can be reduced, which enables a reduction in resistance loss. This results in the implementation of low-loss filter characteristics.

(Embodiment 5)

Figure 9:
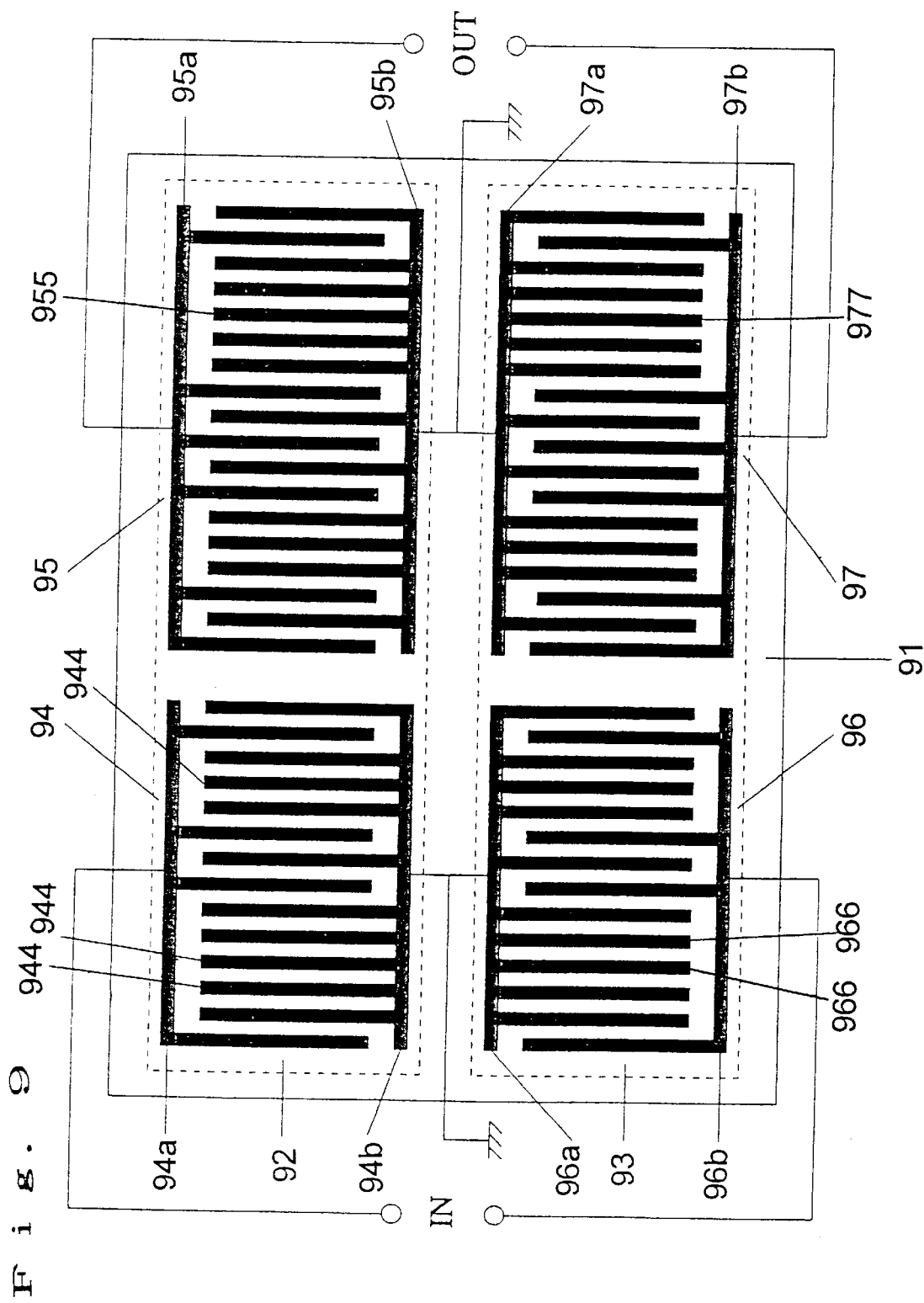
FIG. 9 is a block diagram of an electrode pattern of a surface acoustic wave filter in accordance with a fifth embodiment of the present invention.

FIG. 9 is a block diagram of an electrode pattern showing a fifth embodiment of the surface acoustic wave filter in accordance with the present invention. On a piezoelectric substrate 91, are formed a first filter track 92 and a second filter track 93. The first filter track 92 and the second filter track 93 have a symmetrical construction with respect to the surface acoustic wave propagation direction as axial direction. The first filter track 92 is comprised of an input IDT 94 and an output IDT 95. Similarly, the second filter-track 93 is comprised of an input IDT 96 and an output IDT 97. Further, there is provided a connection between the lower electrode 94b of the input IDT 94 of the first filter track 92 and the upper electrode 96a of the input IDT 96 of the second filter track 93 to form a terminal, which is then connected to an earth. Similarly, there is provided a connection between the lower electrode 95b of the output IDT 95 of the first filter track 92 and the upper electrode 97a of the input IDT 97 of the second filter track 93 to form a terminal, which is then connected to an earth. It is noted that a spacing of 10 λ or more between the first filter track 92 and the second filter track 93 is preferably allowed. This ensures the prevention of mutual interference.

Figure 15:
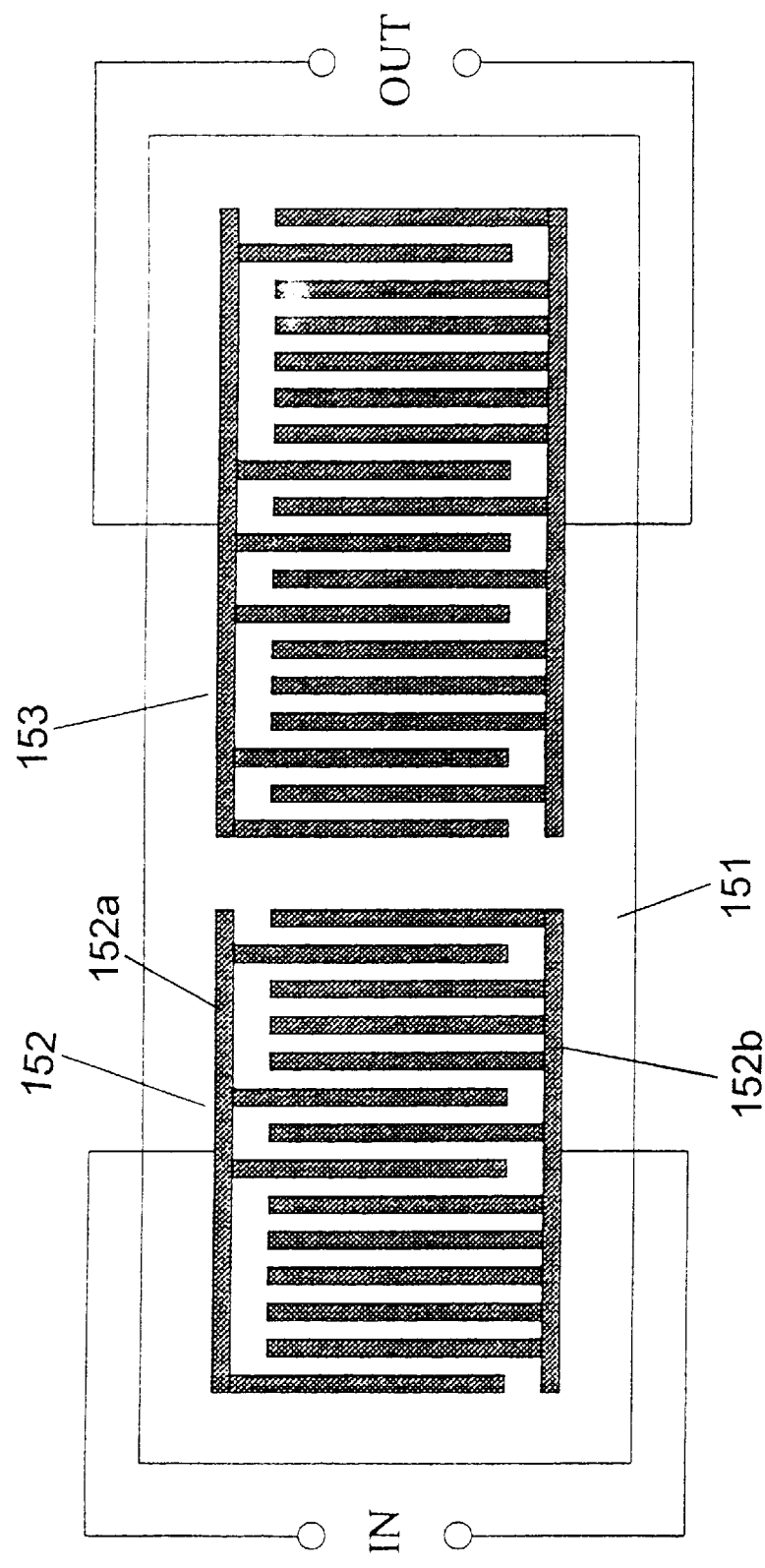
FIG. 15 is an electrode pattern diagram of a conventional surface acoustic wave filter.

The difference between this embodiment and the conventional surface acoustic wave filter shown in FIG. 15 is as follows: that is, the electrodes 152a and 152b each connected to the input terminal pair in the prior art example of FIG. 15 have mutually different electrode configurations, while, in this embodiment, the electrodes 94a and 96b each connected to the input terminal pair have the same electrode configuration. It is noted that the electrodes 94b and 96a also have the same electrode configuration. Similarly, the electrodes 95a and 97b each connected to the output terminal pair have the same electrode configuration. Also, 95b and 97a have the same electrode configuration.

Namely, with the two-track configuration as described above, the electrodes each connected to the respective input and output terminal pairs have the same configuration, respectively. As compared with the conventional surface acoustic wave filter shown in FIG. 15, the balancing between terminals when the balanced type operation is effected is largely improved. This results in improvements in amount of attenuation outside the passband and insertion loss. Giving attention to the amount of attenuation outside the passband, assuming that the center frequency of the filter is fo, it is found to be fo±5 MHz in the case of a filter having a passband of 1.3 MHz, thus it is improved by about 10 dB as compared with the prior art surface acoustic wave filter shown in FIG. 15.

Also, in this embodiment, in the case where the input and output IDTs 94, 95, 96, and 97 of the first filter track 92 and the second filter track 93 each has withdrawal weighting, one electrode of the respective input and output IDTs is provided with dummy electrodes 944, 955, 966, and 977 at the portions from which IDT electrodes have been thinned out, respectively, in order to adjust the acoustic velocity of the surface acoustics waves. FIG. 9 illustrates such an electrode configuration that the dummy electrodes are provided at the lower electrodes 94b and 95b of the input and output IDT electrode pair s 94 and 95 of the first filter track 92 and the upper electrodes 96a and 97a of the input and output IDTS 96 and 97 of the second filter track 93.

However, such an electrode configuration is also conceivable that dummy electrodes are provided at the upper electrodes 94a and 95a of the input and output IDTs 94 and 95 of the first filter track 92 and the lower electrodes 96b and 97b of the input and output IDTs 96 and 97 of the second filter track 93. As in the embodiment of FIG. 9, in such an electrode configuration that dummy electrodes are provided at the lower electrodes 94b and 95b of the input and output IDTs 94 and 95 of the first filter track 92 and the upper electrodes 96a and 97a of the input and output IDTs 96 and 97 of the second filter track 93, the connecting section between the IDT electrode 94b and the IDT electrode 96a, and the connecting section between the IDT electrode 95b and the IDT electrode 97a are connected to an earth, that is, the dummy electrodes are grounded. This reduces the susceptibility to the influences of stray capacitance and the like due to the dummy electrodes, resulting in an improvement in insertion loss.

Figure 10:
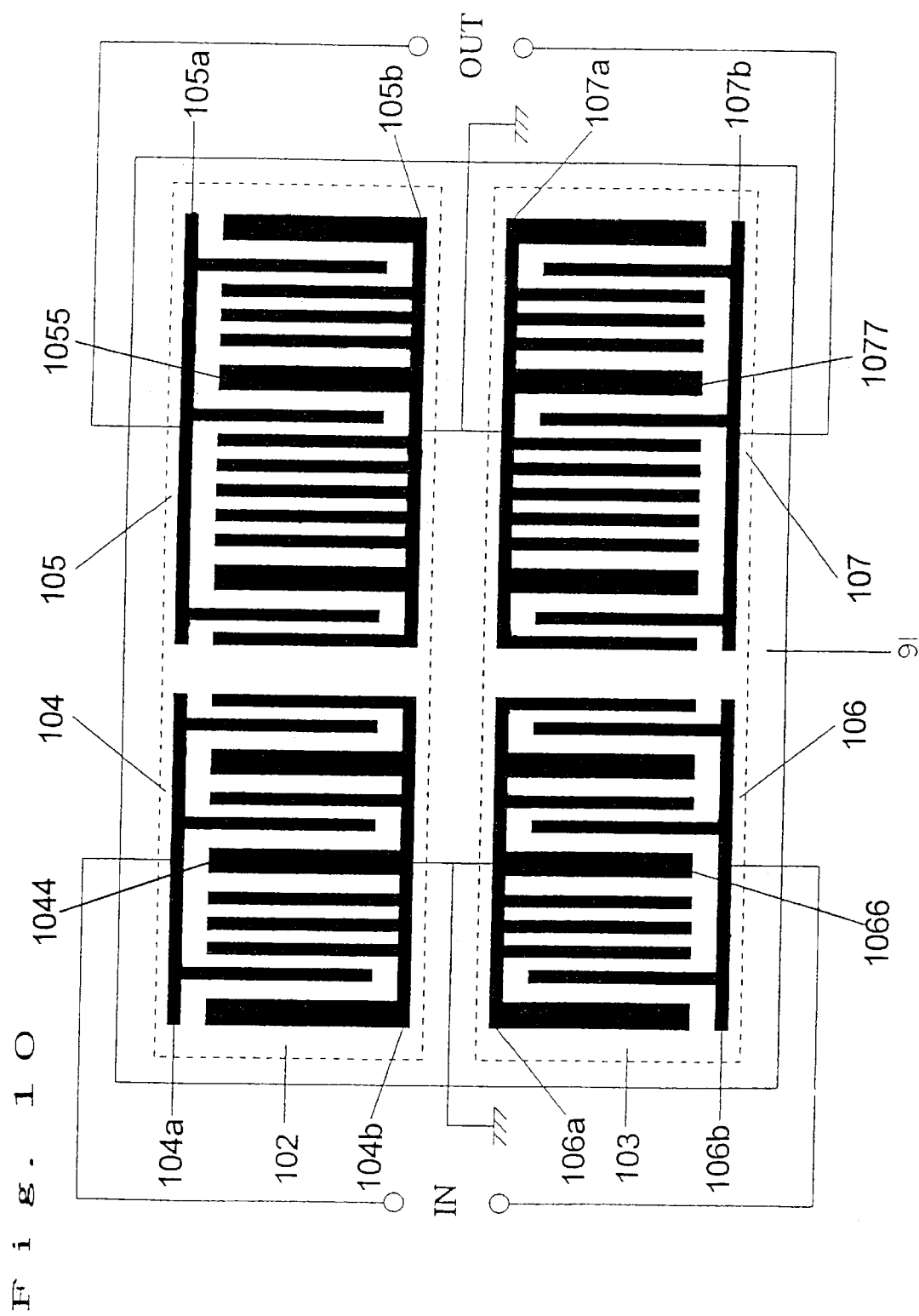
FIG. 10 is a block diagram of an electrode pattern of a surface acoustic wave filter in accordance with the fifth embodiment of the present invention.

FIG. 10 is a block diagram of an electrode pattern in which the input and output IDTs 94, 95, 96, and 97 of the first filter track 92 and the second filter track 93 are single phase uni-directional transducers (SPUDTs) in the embodiment of FIG. 9. The SPUDT electrode is a unidirectional electrode, and it is of an electrode configuration having a reflector in the inside of the IDT.

Referring now to FIG. 10, there is illustrated such an electrode configuration that reflector electrodes 1044, 1055, 1066, and 1077 are provided at the lower electrodes 104b and 105b of input and output IDTs 104 and 105 of a first filter track 102, and the upper electrodes 106a and 107a of input and output IDTs 106 and 107 of a second filter track 103, respectively. However, such an electrode configuration is also conceivable that reflector electrodes are provided at the upper electrodes 104a and 105a of the input and output IDTs 104 and 105 of the first filter track 102, and the lower electrodes 106b and 107b of the input and output IDTs 106 and 107 of the second filter track 103. As in the foregoing case of FIG. 10, in such an electrode configuration that reflector electrodes are provided at the lower electrodes 104b and 105b of the input and output IDTs 104 and 105 of the first filter track 102 and the upper electrodes 106a and 107a of the input and output IDTs 106 and 107 of the second filter track 103, respectively, the connecting section between the IDT electrode 104b and the IDT electrode 106a, and the connecting section between the IDT electrode 105b and the IDT electrode 107a are connected to an earth. The resulting electrode configuration becomes less susceptible to the influences of the stray capacitance, and the like of the dummy electrodes and the reflector electrodes as compared with the latter case. This results in excellent characteristics in insertion loss and amount of attenuation outside the passband.

(Embodiment 6)

Figure 11:
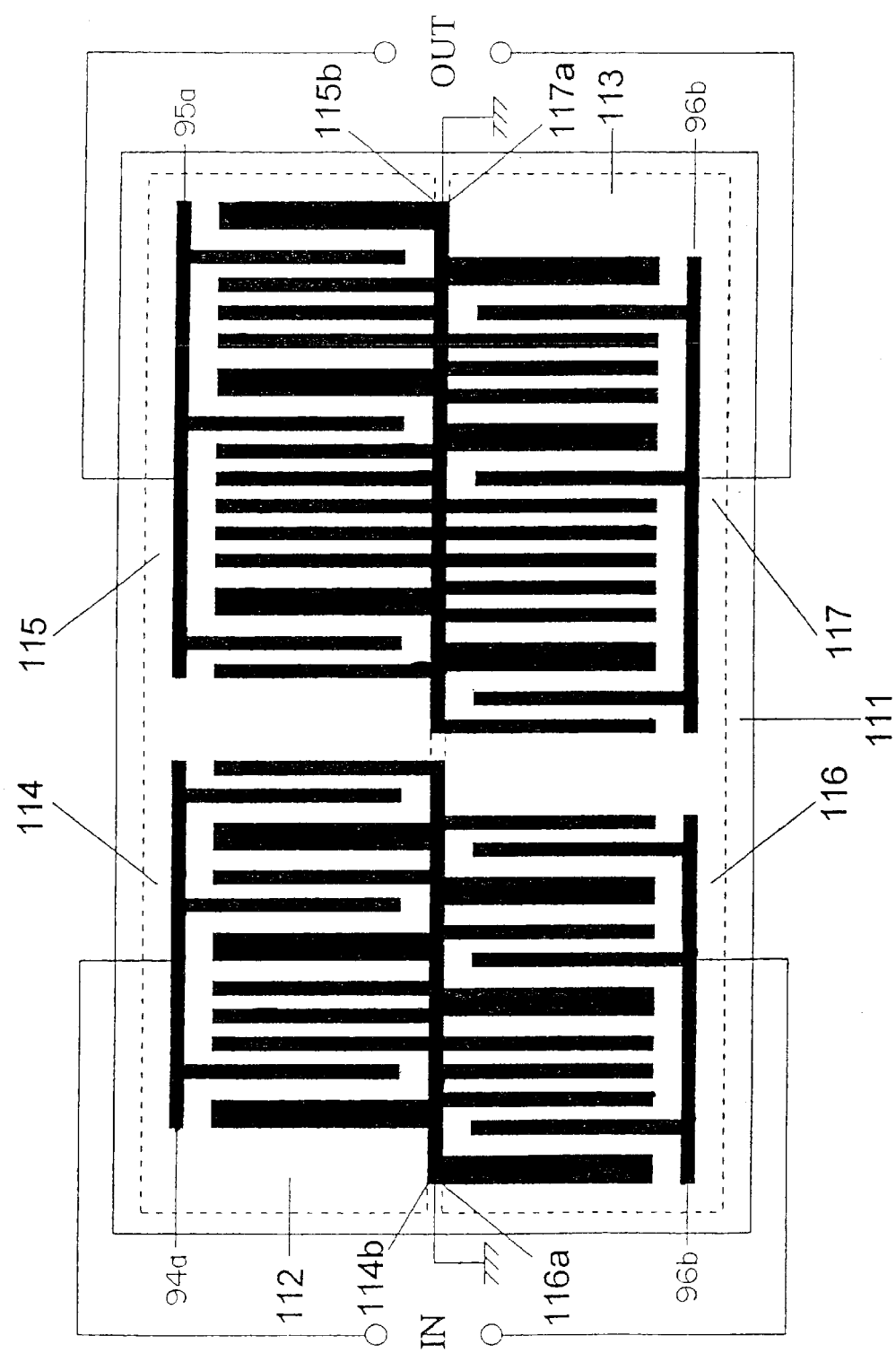
FIG. 11 is a block diagram of an electrode pattern of a surface acoustic wave filter in accordance with a sixth embodiment of the present invention.

FIG. 11 is a block diagram of an electrode pattern showing a sixth embodiment of the surface acoustic wave filter in accordance with the present invention. Referring now to FIG. 11, on a piezoelectric substrate 111, are formed a first filter track 112 and a second filter track 113. The first filter track 112 and the second filter track 113 have the construction as follows.

The first filter track 112 is comprised of an input IDT 114 and an output IDT 115. Similarly, the second filter track 113 is comprised of an input IDT 116 and an output IDT 117. Here, the first filter track 112 is shifted in the surface acoustic wave propagation direction with respect to the second filter track 113 by an integral multiple of λ/2 (λ: wavelength of the surface acoustic wave propagating on the piezoelectric substrate). Consequently, both the tracks form a symmetrical construction with respect to the surface acoustic wave propagation direction as axial direction. Conversely, it can also be said that the two tracks having a symmetrical construction with respect to the surface acoustic wave propagation direction as axial direction are mutually shifted in the surface acoustic wave propagation direction by an integral multiple of λ/2 (λ: wavelength of the surface acoustic wave propagating on the piezoelectric substrate), resulting in the construction of FIG. 11.

There is provided a connection between the lower electrode 114b of the input IDT 114 of the first filter track 112 and the upper electrode 116a of the input IDT 116 of the second track 113 to form a terminal, which is then connected to an earth. Meanwhile, there is provided a connection between the lower electrode 115b of the output IDT 115 of the first filter track 112 and the upper electrode 117a of the output IDT 117 of the second filter track 113 to form a terminal, which is then connected to an earth.

In this step, the first filter track 112 and the second filter track 113 are arranged with being mutually shifted in the surface acoustic wave propagation direction by an integral multiple of λ/2. Accordingly, the first filter track 112 and the second filter track 113 will not be acoustically influenced with each other. Therefore, it is unnecessary to ensure a sufficient distance between the first filter track 112 and the second filter track 113, and hence it becomes possible to implement a substantial downsizing of the device size.

(Embodiment 7)

Figure 12:
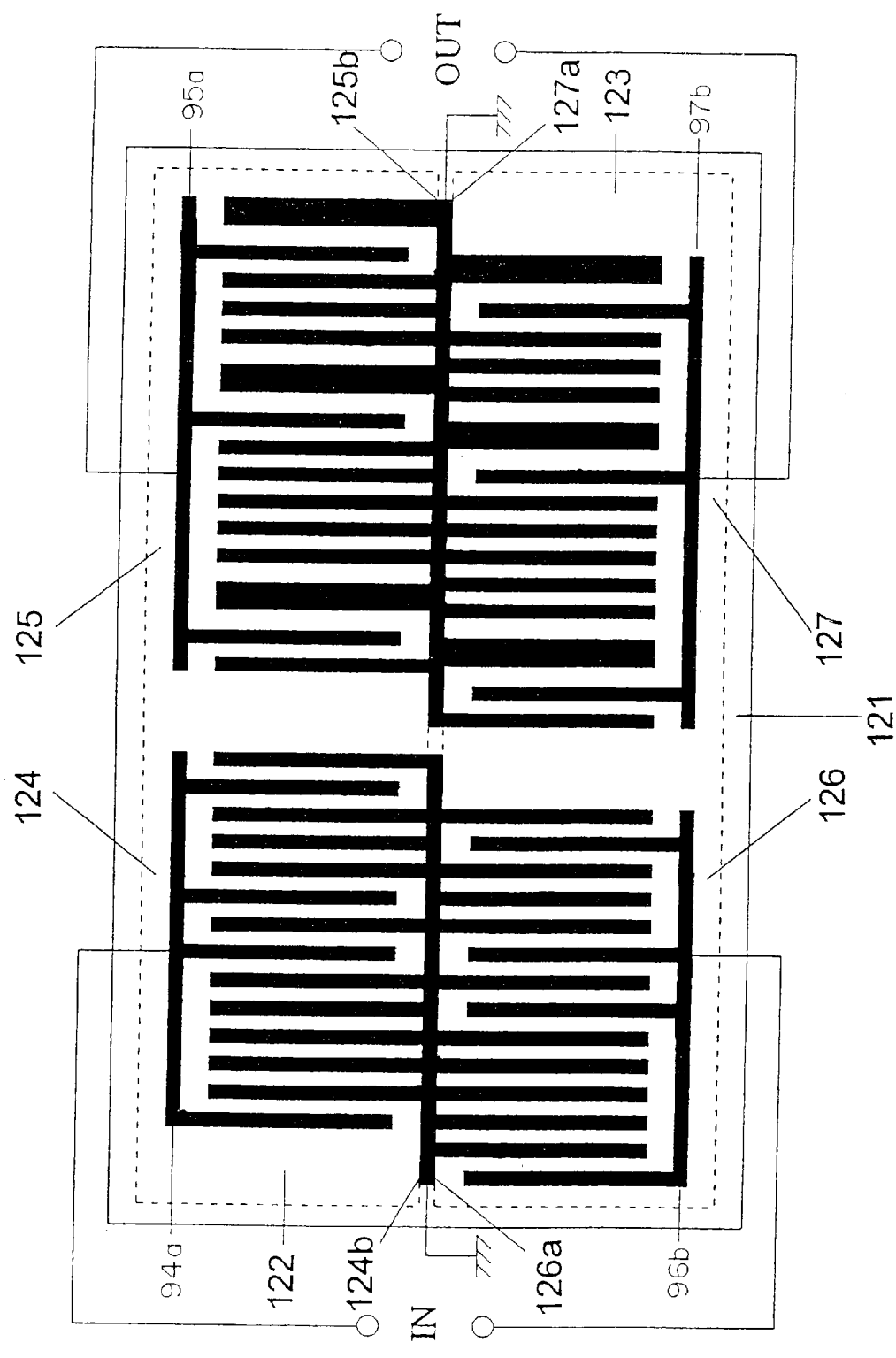
FIG. 12 is a block diagram of an electrode pattern of a surface acoustic wave filter in accordance with a seventh embodiment of the present invention.

FIG. 12 is a block diagram of an electrode pattern showing a seventh embodiment of the surface acoustic wave filter in accordance with the present invention. Referring now to FIG. 12, on a piezoelectric substrate 121, are formed a first filter track 122 and a second filter track 123. The first filter track 122 and the second filter track 123 have the construction as follows.

The first filter track 122 is comprised of an input IDT 124 which is a bidirectional electrode and an output IDT 125 which is a SPUDT electrode. Similarly, the second filter track 123 is comprised of an input IDT 126 which is a bidirectional electrode, and an output IDT 127 which is a SPUDT electrode. Here, the first filter track 122 is shifted in the surface acoustic wave propagation direction with respect to the second filter track 123 by an integral multiple of λ/2. Consequently, both the tracks form a symmetrical construction with respect to the surface acoustic wave propagation direction as axial direction. Conversely, it can also be said that the two tracks having a symmetrical construction with respect to the surface acoustic wave propagation direction as axial direction are mutually shifted in the surface acoustic wave propagation direction by an integral multiple of λ/2 (λ: wavelength of the surface acoustic wave propagating on the piezoelectric substrate), resulting in the construction of FIG. 12.

Further, there is provided a connection between the lower electrode 124b of the input IDT 124 of the first filter track 122 and the upper electrode 126a of the input IDT 126 of the second track 123 to form a terminal, which is then connected to an earth. Meanwhile, there is provided a connection between the lower electrode 125b of the output IDT 125 of the first filter track 122 and the upper electrode 127a of the output IDT 127 of the second filter track 123 to form a terminal, which is then connected to an earth.

In conventional surface acoustic wave filters, with a transversal filter using bi-directional electrodes as input and output IDTs, a large amount of attenuation can be obtained in the vicinity of the passband. However, the input and output IDTs are bi-directional electrodes, and hence a large ripple occurs within the passband under the influence of TTE (Triple Transit Echo). A filter for use in an IF stage of a digital mobile communication device is required to have flat in-passband characteristics, and hence it must be used in a state of impedance mismatching in order to suppress TTE, resulting in a very large insertion loss. On the other hand, in the case where SPUDT electrodes are used as input and output IDTs, the TTE level is very small in a state of impedance matching. This results in a filter with flat in-passband characteristics and low insertion loss. However, the amount of attenuation in the vicinity of the passband deteriorates for implementing a uni-directional property. In the surface acoustic wave filter of the seventh embodiment of the present invention shown in FIG. 12, the one electrode pair is of bi-directional electrodes, while the other is of SPUDT electrodes. This enables suppression of the TTE level in a state of impedance matching. Thus, it becomes possible to implement a surface acoustic wave filter with flatter in-passband characteristics and lower insertion loss as compared with the transversal filter using bi-directional electrodes as input and output IDT electrode pairs, and more excellent in amount of attenuation in the vicinity of the passband as compared with the surface acoustic wave filter using SPUDT electrodes as input and output IDTS.

Figure 13:
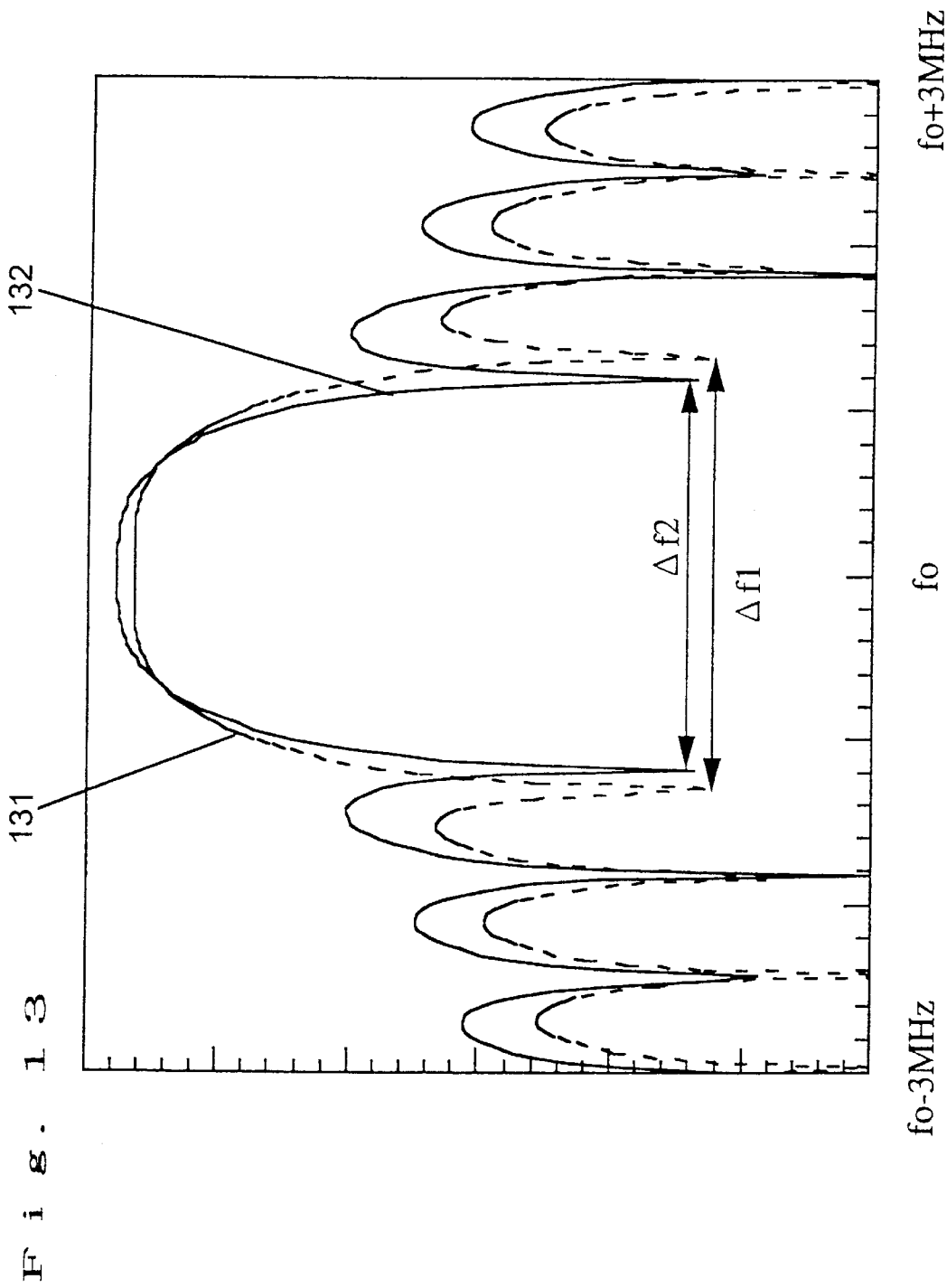
FIG. 13 is a diagram of the impulse response characteristics of input and output IDT electrode pairs of the surface acoustic wave filter shown in FIG. 12.

Also, in this embodiment, referring now to FIG. 13, assuming that a difference between the frequency f1h of the pole on a high-pass side closest to the center frequency and the frequency f1l of the pole on a low-pass side closest to the center frequency in the impulse response characteristic 131 of the input IDTs is Δf1, while a difference between the frequency f2h of the pole on a high-pass side closest to the center frequency and the frequency f2l of the pole on a low-pass side closest to the center frequency in the impulse response characteristic 132 of the output IDTs is Δf2, in the case where the IDTs having the smaller Δf (in this case, the output IDTs 125 and 127) is set to be SPUDT electrodes, the characteristics of the output IDTs 125 and 127 exhibit an increase in side lobe level due to the use of the SPUDT electrodes, which is canceled by trap of the characteristics of the other input IDTs 124 and 126. Consequently, as the whole filter, the side lobe level can be suppressed to obtain an excellent attenuation amount in the vicinity of the passband.

As described above, this embodiment can implement a filter excellent in balancing to achieve improvements in amount of attenuation outside the passband and insertion loss.

It is noted that a description has been given to the example in which two filter tracks are used as shown in FIG. 12 in this embodiment. However, as shown in FIG. 14, assuming that the configuration of only one filter track is adopted, and the IDT having the smaller Δf (in this case, an output IDT 143) is a SPUDT electrode, an improvement in attenuation characteristics in the vicinity of the passband can be implemented in the same manner as in this embodiment.

Figure 14:
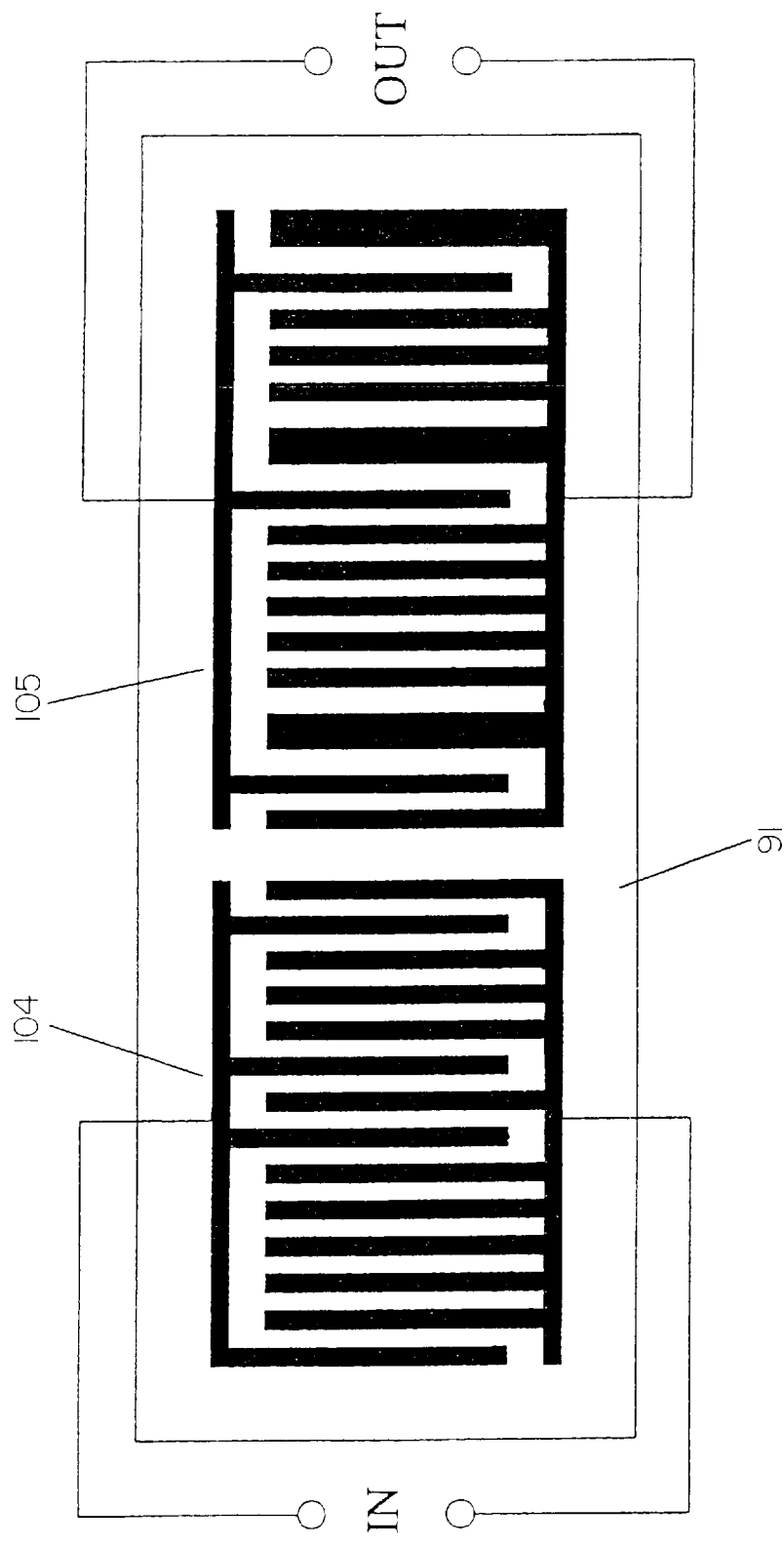
FIG. 14 is a block diagram of an electrode pattern of a surface acoustic wave filter in accordance with the seventh embodiment of the present invention.

Also, the above-described filter of the one-track configuration is assumed to be a balanced type filter in FIG. 14. However, even if it is assumed that such a configuration of input and output terminals is adopted in which the one is of a balanced type, while the other is of an unbalanced type, the same effects can be obtained. Thus, the present invention can implement a small-sized and low-loss surface acoustic wave filter excellent in amount of attenuation in the vicinity of the passband.

Also, as a piezoelectric substrate in the present invention, it is preferable that a ST cut-quartz excellent in temperature characteristics is used. However, LiTaO3, LiNbO3, Li2B4O7, La3Ga5SiO14, and the like can be used as a substrate. Further, as electrode materials, it is preferable to use aluminium of which the film thickness is easy to control, and having a relatively small density, however, a gold electrode can also be used.

It is noted that, the communication device of the present invention is a communication device characterized by including the surface acoustic filter described above, a signal processing circuit for conducting a signal processing using the filter, a transmitter for transmitting the signals processed by the signal processing circuit, and a receiver for receiving an electronic radio wave.

What is claimed is:

1. A surface acoustic wave filter, comprising:

a piezoelectric substrate; a first filter track having a first input interdigital transducer, a first reflector, and a first output interdigital transducer disposed therebetween; and a second filter track having a second input interdigital transducer, a second reflector, and a second output interdigital transducer disposed therebetween on said piezoelectric substrate, wherein said first filter track and said second filter track are substantially arranged in parallel to each other, the distance between said first input interdigital transducer and said first output interdigital transducer is equal to the distance between said second input interdigital transducer and said second output interdigital transducer, the distance between said first output interdigital transducer and said first reflector differs from the distance between said second output interdigital transducer and said second reflector by $(n\lambda+\lambda/4)$ (n: natural number), assuming that the wavelength of the surface acoustic wave is $\lambda$, an electrical connection mutually in opposite phase is established for any one of between said first input interdigital transducer and said second input interdigital transducer, or between said first output interdigital transducer and said second output interdigital transducer, while an electrical connection mutually in phase is established for the other, and each positive electrode and negative electrode of respective output interdigital transducers of said first and second filter tracks are both so configured that, electrode fingers are arranged in groups of two in a cycle of $\lambda$, each of the electrode fingers has a width along the surface acoustic wave propagation direction of approximately $\lambda/8$, while the center-to-center distance between the two electrode fingers of the one group is $\lambda/4$, and the space between adjacent, one pair of electrode fingers of said positive electrode and one pair of electrode fingers of said negative electrode is $\lambda/2$;

wherein both said first input interdigital transducer and said second input transducer are unidirectional transducers.

2. A surface acoustic wave filter according to claim 1, wherein at least one or more interdigital transducers of said first input interdigital transducer, said second input interdigital transducer, said first output interdigital transducer, and said second output interdigital transducer have a withdrawal weighting.

3. A communication device, comprising: said surface acoustic wave filter according to claim 1; a signal processing circuit for processing a signal by the use of said filter; a transmitter for transmitting the signal processed by said signal processing circuit, and a receiver for receiving an electronic radio wave.

4. A surface acoustic wave filter according to claim 1, wherein said uni-directional transducer is a single phase uni-directional transducer (SPUDT).

5. A surface acoustic wave filter according to claim 1, wherein each positive electrode and negative electrode of respective input interdigital transducers of said first and second filter tracks are both so configured that, electrode fingers are arranged in groups of two in a cycle of $\lambda$, each of the electrode fingers has a width along the surface acoustic wave propagation direction of approximately $\lambda/8$, while the center-to-center distance between the two electrode fingers of the one group is $\lambda/4$, and the space between adjacent, one pair of electrode fingers of said positive electrode and one pair of electrode fingers of said negative electrode is $\lambda/2$.

6. A surface acoustic wave filter according to claim 1, wherein each reflection coefficient of said first reflector and said second reflector is approximately 1.

7. A surface acoustic wave filter according to claim 1, wherein said first reflector and said second reflector are weighted by the width of said electrode finger.

8. A surface acoustic wave filter according to claim 1, wherein said first reflector and said second reflector are weighted by the position of said electrode finger.

9. A surface acoustic wave filter according to claim 1, wherein said first reflector and said second reflector are weighted by a combination of the width and the position of said electrode finger.

10. A surface acoustic wave filter according to claim 1, wherein said first reflector and said second reflector are configured by two or more reflectors each having different reflection characteristics.

11. A surface acoustic wave filter according to claim 1, wherein said first input interdigital transducer and said second input interdigital transducer are electrically connected in phase with each other, and said first and second output interdigital transducers are implemented by one interdigital transducer.

12. A surface acoustic wave filter comprising:

a piezoelectric substrate; a first filter track having a first input interdigital transducer, a first reflector, and a first output interdigital transducer disposed therebetween; and a second filter track having a second input interdigital transducer, a second reflector, and a second output interdigital transducer disposed therebetween on said piezoelectric substrate, wherein said first filter track and said second filter track are substantially arranged in parallel to each other, the distance between said first input interdigital transducer and said first output interdigital transducer is equal to the distance between said second input interdigital transducer and said second output interdigital transducer, the distance between said first output interdigital transducer and said first reflector differs from the distance between said second output interdigital transducer and said second reflector by $(n\lambda+\lambda/4)$ (n: natural number), assuming that the wavelength of the surface acoustic wave is $\lambda$, an electrical connection mutually in opposite phase is established for any one of between said first input interdigital transducer and said second input interdigital transducer, or between said first output interdigital transducer and said second output interdigital transducer, while an electrical connection mutually in phase is established for the other, and each positive electrode and negative electrode of respective output interdigital transducers of said first and second filter tracks are both so configured that, electrode fingers are arranged in groups of two in a cycle of $\lambda$, each of the electrode fingers has a width along the surface acoustic wave propagation direction of approximately $\lambda/8$, while the center-to-center distance between the two electrode fingers of the one group is $\lambda/4$, and the space between adjacent, one pair of electrode fingers of said positive electrode and one pair of electrode fingers of said negative electrode is $\lambda/2$;

wherein the upper electrode of said first input interdigital transducer and the lower electrode of said second input interdigital transducer form balanced type input terminals, and the lower electrode of said first input interdigital transducer and the upper electrode of said second input interdigital transducer are grounded.

13. A surface acoustic wave filter, comprising:

a piezoelectric substrate; a first filter track having a first input interdigital transducer, and a first output interdigital transducer; and a second filter track having a second input interdigital transducer, and a second output interdigital transducer on said piezoelectric substrate, said first filter track and said second filter track having the same filter response, wherein said first input interdigital transducer and said first output interdigital transducer are arranged at a prescribed distance from each other, said second input interdigital transducer and said second output interdigital transducer are arranged at a prescribed distance from each other, said first filter track and said second filter track are substantially arranged in parallel to each other, said first filter track and said second filter track have a symmetrical construction along the surface acoustic wave propagation direction as axial direction, both the lower electrode of said first input interdigital transducer and the upper electrode of said second input interdigital transducer are grounded, both the lower electrode of said first output interdigital transducer and the upper electrode of said second output interdigital transducer are grounded, the upper electrode of said first input interdigital transducer and the lower electrode of said second input interdigital transducer form balanced type input terminals, and the upper electrode of said first output interdigital transducer and the lower electrode of said second output interdigital transducer form balanced type output terminals;

wherein both of said first input and output interdigital transducers and said second input and output interdigital transducers are single phase uni-directional transducers (SPUDTs), reflector electrodes are provided at the lower electrode of the input SPUDT electrode pair of said first filter track, and the upper electrode of the input SPUDT electrode pair of said second filter track, respectively, and reflector electrodes are provided at the lower electrode of the output SPUDT electrode pair of said first filter track, and the upper electrode of the output SPUDT electrode pair of said second filter track, respectively.

14. A surface acoustic wave filter according to claim 13, wherein dummy electrodes are formed at the lower electrode of said first input interdigital transducer and the upper electrode of said second input interdigital transducer, respectively, to conduct a withdrawal weighting, and dummy electrodes are formed at the lower electrode of said first output interdigital transducer and the upper electrode of said second output interdigital transducer, respectively, to conduct a withdrawal weighting.

15. A surface acoustic wave filter according to claim 13, wherein said first filter track and said second filter track are formed at a distance of 10 $\mu$ or more from each other.

16. A surface acoustic wave filter, comprising:

a piezoelectric substrate; a first filter track having a first input interdigital transducer, and a first output interdigital transducer; and a second filter track having a second input interdigital transducer, and a second output interdigital transducer on said piezoelectric substrate, said first filter track and said second filter track having the same filter response, wherein said first input interdigital transducer and said first output interdigital transducer are arranged at a prescribed distance from each other, said second input interdigital transducer and said second output interdigital transducer are arranged at a prescribed distance from each other, said first filter track and said second filter track are substantially arranged in parallel to each other, said first filter track and said second filter track have such an asymmetrical construction that is said first filter track is shifted in the surface acoustic wave propagation direction with respect to said second filter track by an integral multiple of $\lambda/2$ ($\lambda$: wavelength of the surface acoustic wave propagating on the piezoelectric substrate), said first filter track and said second filter track have a symmetrical construction along the surface acoustic wave propagation direction as axial direction, both the lower electrode of said first input interdigital transducer and the upper electrode of said second input interdigital transducer are grounded, both the lower electrode of said first output interdigital transducer and the upper electrode of said second output interdigital transducer are grounded, the upper electrode of said first input interdigital transducer and the lower electrode of said second input interdigital transducer form balanced type input terminals, and the upper electrode of said first output interdigital transducer and, the lower electrode of said second output interdigital transducer form balanced type output terminals.

17. A surface acoustic wave filter, comprising:

a piezoelectric substrate, an input interdigital transducer, and an output interdigital transducer formed at a prescribed distance from said input interdigital transducer, on said piezoelectric substrate, wherein any one of said input interdigital transducer or said output interdigital transducer is a single phase uni-directional transducer (SPUDT), and assuming that a difference between the frequency f1h of the pole on a high-pass side closest to the center frequency and the frequency f1l of the pole on a low-pass side closest to the center frequency in the impulse response characteristic of said input interdigital transducer is $\Delta f1$, while a difference between the frequency f2h of the pole on a high-pass side closest to the center frequency and the frequency f2l of the pole on a low-pass side closest to the center frequency in the impulse response characteristic of said output interdigital transducer is $\Delta f2$, the interdigital transducer having the smaller one of said $\Delta f1$ and $\Delta f2$ is a SPUDT electrode.

* * * * *